United States Patent
Parrish et al.

(10) Patent No.: US 11,892,356 B2
(45) Date of Patent: Feb. 6, 2024

(54) DESIGN, TEST, AND OPERATION OF A SMALL THERMAL IMAGING CORE

(71) Applicant: Seek Thermal, Inc., Goleta, CA (US)

(72) Inventors: William J. Parrish, Santa Barbara, CA (US); Derek Moran, Santa Barbara, CA (US); Blake Henry, Santa Barbara, CA (US)

(73) Assignee: Seek Thermal, Inc., Goleta, CA (US)

( * ) Notice: Subject to any disclaimer, the term of this patent is extended or adjusted under 35 U.S.C. 154(b) by 660 days.

(21) Appl. No.: 17/005,146

(22) Filed: Aug. 27, 2020

(65) Prior Publication Data

US 2021/0063244 A1    Mar. 4, 2021

Related U.S. Application Data

(60) Provisional application No. 62/894,506, filed on Aug. 30, 2019.

(51) Int. Cl.
*G01J 5/10* (2006.01)
*G01J 5/0806* (2022.01)
(Continued)

(52) U.S. Cl.
CPC .............. *G01J 5/10* (2013.01); *G01J 5/0806* (2013.01); *G01K 7/003* (2013.01); *H10N 10/13* (2023.02); *G01J 5/48* (2013.01); *G01J 5/80* (2022.01)

(58) Field of Classification Search
CPC .... G01J 5/10; G01J 5/0806; G01J 5/48; G01J 5/80; G01J 5/53; G01J 5/54; G01K 7/003; H10N 10/13; H04N 17/002
(Continued)

(56) References Cited

U.S. PATENT DOCUMENTS

| 4,967,082 A | 10/1990 | Cooke et al. |
| 5,471,055 A | 11/1995 | Costanzo et al. |

(Continued)

FOREIGN PATENT DOCUMENTS

| KR | 101 251 649 | 4/2013 |
| WO | WO 2014/106276 | 7/2014 |

(Continued)

OTHER PUBLICATIONS

Goushcha, et al., "Automatic Test System for Wafer Level Probing Photodiode of Optical and Electrical Parameters of Array Dies," 2006 IEEE Nuclear Science Symposium Conference Record, vol. 2. Oct. 29, 2006.

(Continued)

*Primary Examiner* — Lisa M Caputo
*Assistant Examiner* — Janice M Soto
(74) *Attorney, Agent, or Firm* — Knobbe, Martens, Olson & Bear LLP

(57) ABSTRACT

Test procedures and equipment for the test and calibration of ultra-small thermal imaging cores, or micro-cores are disclosed. Test fixtures for calibration and adjustment that allow for operation and image acquisition of multiple cores at a time may also be provided. Test procedures and fixtures that allow for full temperature calibration of each individual core, as well as providing data useful for uniformity correction during operation, may also be provided as part of the test and manufacture of the core.

15 Claims, 8 Drawing Sheets

(51) Int. Cl.
*G01K 7/00* (2006.01)
*H10N 10/13* (2023.01)
*G01J 5/48* (2022.01)
*G01J 5/80* (2022.01)

(58) Field of Classification Search
USPC .......................................................... 374/1
See application file for complete search history.

(56) References Cited

U.S. PATENT DOCUMENTS

| | | | |
|---|---|---|---|
| 5,811,808 | A | 11/1998 | Cannata et al. |
| 7,683,321 | B1 | 3/2010 | King et al. |
| 8,378,290 | B1* | 2/2013 | Speake ............... G01J 5/20 |
| | | | 250/252.1 |
| 2002/0074499 | A1 | 6/2002 | Butler |
| 2002/0177330 | A1 | 11/2002 | Haffenden |
| 2003/0095583 | A1* | 5/2003 | Maccarone ........... G01J 5/53 |
| | | | 374/2 |
| 2004/0041911 | A1 | 3/2004 | Odagiri |
| 2008/0170228 | A1 | 7/2008 | Jiang |
| 2008/0210872 | A1 | 9/2008 | Grimberg |
| 2010/0220193 | A1 | 9/2010 | Hogasten |
| 2011/0299846 | A1 | 12/2011 | Weisbach |
| 2012/0312976 | A1* | 12/2012 | Boulanger ........... G01J 5/53 |
| | | | 250/252.1 |
| 2013/0178245 | A1 | 7/2013 | Kulas |
| 2014/0240689 | A1 | 8/2014 | Arbouzov |
| 2014/0300809 | A1 | 10/2014 | Oliveira |
| 2015/0177313 | A1 | 6/2015 | Hoelter et al. |
| 2015/0281601 | A1* | 10/2015 | Ganapathi ....... H01L 27/14685 |
| | | | 438/66 |
| 2015/0312488 | A1 | 10/2015 | Kostrzewa et al. |
| 2016/0061883 | A1 | 3/2016 | Engberg et al. |
| 2016/0334284 | A1* | 11/2016 | Kaplun Mucharrafille ................ |
| | | | G01K 15/00 |
| 2018/0180485 | A1* | 6/2018 | Macmillan ............... G01J 5/10 |

FOREIGN PATENT DOCUMENTS

| | | |
|---|---|---|
| WO | WO 2014/173464 | 10/2014 |
| WO | WO 2015/070105 | 5/2015 |

OTHER PUBLICATIONS

"Customized Wafer Probing Solutions," MicroXact, Inc., 2012, accessed Jun. 27, 2016.

Duykers, "Test Results of a 'Factory' Calibration Technique for Non-Uniformity Correction of an InSb Infrared System," Proc. SPIE 3063, Infrared Imaging Systems: Design, Analysis, Modeling, and Testing VIII. Jun. 16, 1997.

Whicker, "Automated Radiometric Cryoprobe of IRFPA Wafers," Proc. SPIE 2228, Producibility of II-VI Materials and Devices. Jul. 13, 1994.

SUSS Report, Feb. 2009 issue, SUSS MicroTec AG. Jan. 2009.

* cited by examiner

DESIGN, TEST, AND OPERATION OF A SMALL THERMAL IMAGING CORE

CROSS-REFERENCE TO RELATED APPLICATIONS

This application claims the benefit of U.S. Provisional Application Ser. No. 62/894,506, filed Aug. 30, 2019, entitled "DESIGN, TEST, AND OPERATION OF A SMALL THERMAL IMAGING CORE," which is hereby incorporated by reference in its entirety.

BACKGROUND

The specification relates to a very small thermal imaging core and, in particular, to the calibration and test of a small thermal imaging core that enables the inclusion of thermal imaging into small devices such as smartphones, miniature drones, very small monitoring/security systems, and the like.

The increasing availability of high-performance, low-cost uncooled thermal imaging devices, such as those based on bolometer focal plane arrays (FPAs), is enabling the design and production of consumer-oriented thermal imaging cameras and sensors capable of quality thermal imaging. Such thermal imaging systems have long been expensive and difficult to produce, thus limiting the employment of high-performance, long-wave imaging to high-value instruments only available for aerospace, military, or large-scale commercial applications. Thermal imaging systems of a given design (produced in quantity) may have different design requirements than complex military or industrial systems. Providing thermal imagers for consumer applications with challenging cost and space requirements, such as thermal imagers for smartphones and other personal electronic devices (PED's), may benefit from new test and calibration techniques of very small thermal imaging cores.

SUMMARY

Example embodiments described herein have innovative features, no single one of which is indispensable or solely responsible for their desirable attributes. Without limiting the scope of the claims, some of the advantageous features will now be summarized.

In some embodiments test procedures and equipment for the test and calibration of ultra-small thermal imaging cores, or micro-cores, may be provided. Test fixtures for calibration and adjustment that allow for operation and image acquisition of multiple cores at a time may also be provided. Test procedures and fixtures that allow for full temperature calibration of each individual core, as well as providing data useful for uniformity correction during operation, may also be provided as part of the test and manufacture of the core.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure.

DETAILED DESCRIPTION

Figure 1A:
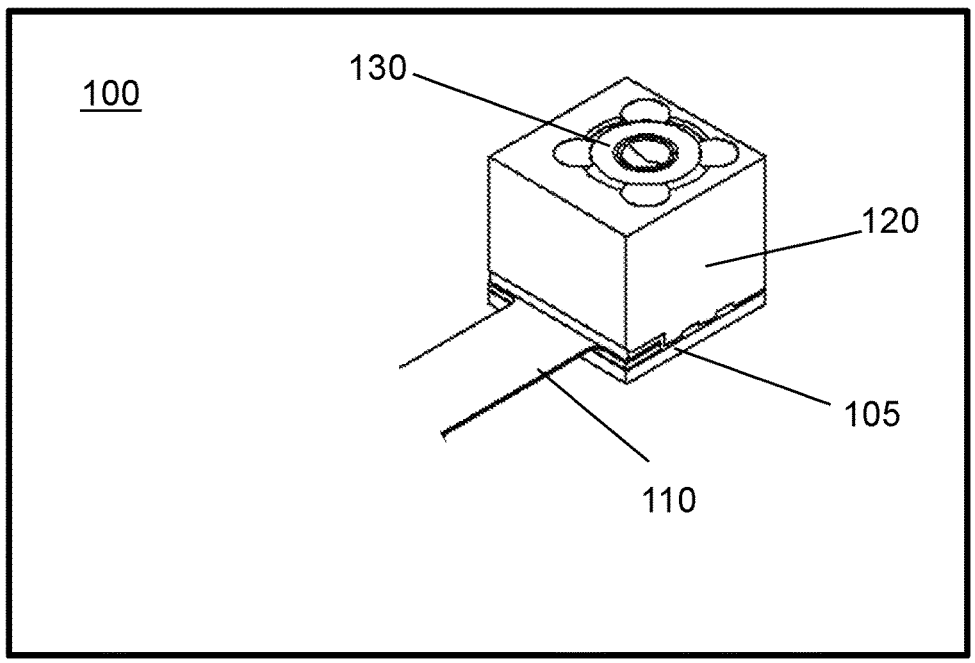
FIGS. 1A, 1B, 1C, and 1D show the general elements of an illustrative thermal imaging core.

The disclosed processes, calibrations and test set-ups disclosed herein may be implemented as modules or elements that may be include programmed computer methods or a digital logic methods and may be implemented using a combination of any of a variety of analog and/or digital discrete circuit components (transistors, resistors, capacitors, inductors, diodes, etc.), programmable logic, microprocessors, microcontrollers, application-specific integrated circuits, or other circuit elements. A memory configured to store computer programs or computer executable instructions may be implemented along with discrete circuit components to carry out one or more of the methods described herein. In certain implementations, the disclosed methods and test set-ups may be implemented for use with one or more focal plane arrays (FPA) on a camera core, wherein the processor and memory components executing the disclosed methods may be on a one or more processing devices. In general, digital control functions, image acquisition, image processing, and image display/analysis may be distributed across one or more digital elements or processors. Referring to a system processor or any controller in any of the disclosed embodiments should not be interpreted as implying the control and processing functionality resides in a single element.

As a particular example of some advantages provided by the disclosed systems and methods, an imaging system to be tested and/or calibrated can include a thermal imaging focal plane array (FPA) configured to acquire images of a scene. The FPA can include a two-dimensional array of N detectors and configured to output a two-dimensional image of the scene. For imaging purposes, image frames, typically data from all or some of the detectors $N_f$, are produced by the FPA where each successive frame contains data from the array captured in successive time windows. Thus, a frame of data delivered by the FPA comprises $N_f$ digital words, each word representing the signal of a particular pixel $S_{x,y}$ in the image. These digital words are usually of a length determined by the analog-to-digital (A/D) conversion process. For example, if the pixel data is converted with a 14-bit A/D, the pixel words may be 14 bits in length and there may be 16384 counts per word. The A/D conversion words may, in some embodiments, be encoded in formats compatible with standard fixed or floating point processing, such as 16 bits. For an infrared (IR) camera used as a thermal imaging system, these words may correspond to an intensity of radiation measured by each pixel in the array. In a particular example, for a bolometer IR FPA the intensity per pixel usually is related to the temperature of the corresponding part of the imaged scene, with lower values corresponding to colder regions and higher values to hotter regions. It may be desirable to display this data on a visual display.

Each pixel in an FPA may include a radiation detector that generates relatively small signals in response to detected radiation, such as in an infrared imaging array. These signals may be relatively small compared to signals or signal levels in the FPA arising from sources not caused by incident radiation, or non-image signals, wherein these non-image signals are related to the materials, structure, and/or components of the FPA. For example, pixels in an FPA can include interface circuitry including resistor networks, transistors, and capacitors on a readout integrated circuit (ROIC) that may be directly interfaced to the array of detectors. For instance, a microbolometer detector array, a micro-electrical mechanical system (MEMS) device, may be manufactured using a MEMS process. The associated ROIC, however, may be fabricated using electronic circuit techniques. These two components can be combined to form the FPA. The combination of the interface circuitry and the detector itself may have offset and temperature behaviors that are relatively large compared to the signals produced in response to incident radiation on the detectors. Thus, it is often desirable to compensate for these effects that are not related to the image signal before displaying or otherwise processing the image data.

In general, the present disclosure relates to small thermal imaging modules or micro-cores, such as modules intended for internal installation in smartphones or other personal electronic devices (PED's), as well as other small devices such as very small security cameras or environmental monitoring cameras. The system in which the core is installed can be the host system, and the combination of the core with the host or hosts can comprise a complete thermal imaging system. These thermal imaging camera cores are intended as modules that can integrate with systems or devices already having one or more of processing, display, user interface, and other such functions. As such these micro-cores may be analogous to the visible camera modules commonly made for integration with PED's, in that they are compatible with physical integration and receive power/control signals from the device with which they are integrated, and provide image data to the device for display or other image processing. Cores intended for such use may need to be very small, inexpensive, and producible in volumes unprecedented in the thermal imaging field. Producing a thermal imaging micro-core on such a size scale, and with the production volume required for inclusion within the housing of a smartphone, requires many innovative features in the structural design, adjustment setup, testing, and actual operation. Testing can desirably be comprehensive to ameliorate the lack of design flexibility in an ultra-small unit—basically each unit should be fully characterized over the expected ambient and scene temperature requirements rather than relying on designed-in mitigation of thermal and environmental effects, as is possible in larger units. The operational aspects of such a core face challenges as well, such as the difficulty of including typical design features such as shutters for non-uniformity correction (NUC). Mitigating these challenges may in part benefit from comprehensive test and calibration of all cores. As such, comprehensive testing may need to be accomplished at very high throughput.

One or more embodiments may provide for efficient and inexpensive testing of extremely small thermal imaging cores, or micro-cores. Advantageously, this could lead to the volumes and price points suitable for inclusion in (PED's) such as smartphones.

One or more embodiments may provide for a complete calibration of every core. Advantageously, this may compensate for thermal imager design elements not practical for very small cores.

One or more embodiments may provide test set-ups capable of very high throughput along with comprehensive testing of thermal micro-cores. Advantageously, complete calibration data may be used to compensate for design limitations, such as lack of a shutter during actual use of the micro-core.

Figure 1B:
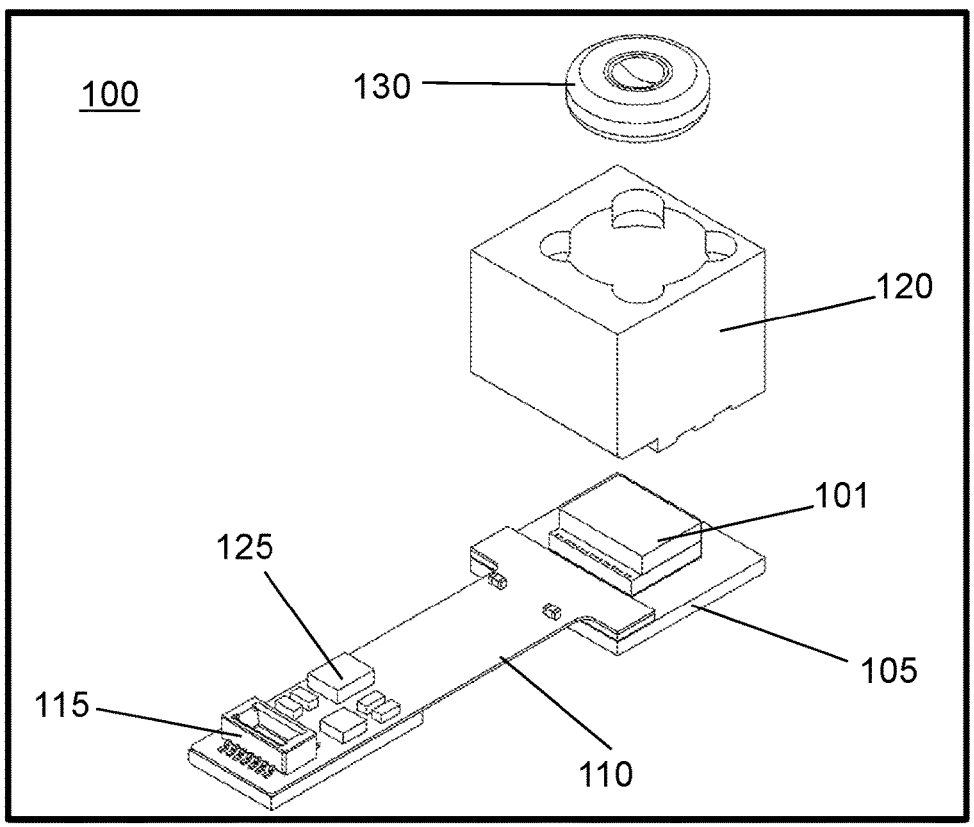

Referring to FIGS. 1A and 1B, the general elements of a thermal imaging module, or micro-core 100, are shown.

Examples of the various hardware and digital logic/programming elements for thermal imaging systems are variously disclosed in U.S. patent application Ser. No. 14/829,500, filed Aug. 18, 2015, U.S. patent application Ser. No. 14/292,124, filed May 30, 2014, U.S. patent application Ser. No. 14/829,490, filed Aug. 18, 2015, U.S. patent application Ser. No. 14/817,989, filed Aug. 4, 2015, U.S. patent application Ser. No. 14/817,847, filed Aug. 4, 2015, U.S. patent application Ser. No. 14/244,533, filed Apr. 3, 2014, U.S. patent application Ser. No. 14/817,689, filed Aug. 4, 2015, U.S. patent application Ser. No. 14/817,730, filed Aug. 4, 2015, U.S. patent application Ser. No. 62/355,797, filed Jun. 6, 2016, and U.S. patent application Ser. No. 62/436,694, filed Dec. 20 2016; all owned by the assignee of the current application and each of which is incorporated by reference herein in its entirety. These referenced applications describe a variety of imaging system configurations and various techniques for adjusting for artifacts and correcting for degradations in image quality that arise at least in part due to various properties and characteristics of the imaging systems.

Optics, shown as lens 130 held in lens housing 120, but may include other optical elements, is configured to capture infrared radiation from an external scene and focus the radiation on FPA 101. FPA 101 typically includes a square or rectangular array of IR photodetectors and some level of electronics configured to convert the captured radiation to electrical data typically a digital data stream representative of an image of the scene. In the exemplary micro-core shown, FPA 101 is bonded onto substrate 105. Housing 120 with lens 130 is also bonded onto substrate 105, with the lens 130 disposed to capture and focus light onto FPA 101. In an embodiment intended for installation in a smart phone, it is important to understand that the longest dimension practical for the housing-lens-FPA substrate assembly is considerably less than an inch, and possibly the requirement may be less than 0.5" or even less than 0.3". This is very small by thermal imaging standards.

For such a small camera core, thermal considerations, which are always a concern for thermal imagers as described in the incorporated references, are especially critical. Thus, novel design features are necessary. For instance, the FPA and lens may need to remain at a fixed distance, which is difficult for such a small device where even small temperature induced dimension changes would be enough to affect imager performance. Thus, in the embodiment shown, substrate 105 is chosen to thermally match FPA 101. Although any combination of thermally matched materials would be beneficial, as described in the incorporated references, FPA 101 may be an array of microbolometer radiation detectors fabricated onto readout electronics to form the FPA. FPA 101 may, for many embodiments, be fabricated from a silicon wafer. Choosing a segment diced from a silicon wafer as the material choice for substrate 105 achieves both a strong material and thermal match between the substrate and FPA. This choice for substrate 105 has proven to be very beneficial.

Housing 120 may be fabricated from a variety of materials such as aluminum or zinc alloys. Suitable low reflectivity coatings may be applied to the housing to mitigate stray light effects within the lens housing. Lens 130 may be produced from a variety of materials suitable for thermal wavelengths, such as chalcogenides, sapphire, and others. For instance, lens 130 may be a molded chalcogenide lens in some embodiments, sized just smaller than the housing surface dimensions.

Also attached to substrate 105 is circuit element 110, disposed to connect FPA 101 to connector 115. The connections may be required to be flexible, so in one embodiment the circuit element is a flexible printed circuit (flex circuit). In the simplest embodiment, flex circuit 110 may be bonded to substrate 105, and connections from pads on the flex circuit to pads on the FPA may be made by wire bonds. Even in this configuration all assembly may accomplished with pick-and-place and bonding equipment compatible with smartphone manufacturing. In more complicated embodiments, substrate 105 may be fabricated with pads and circuit traces configured to solder and/or make bump connections between the FPA 101, substrate 105, and flex circuit 110 so that assembly automation may be even further enhanced.

Circuit element 110's exact configuration can depend on each host system's installation requirements, and thus is shown as open ended in FIG. 1A. For some installations connector 115 may be chosen to be compatible with internal smartphone conventions. Typically, such a connector can carry standard power connections and connections for some sort of communications protocol such as SPI, USB, or a direct connection to a host system processor. Thus, some circuitry may be required on core 100. In one embodiment, circuitry 125 is placed on the connector end of the flex circuit 110 for thermal reasons. Circuitry may include power conditioning and a clock generator. FPA 101 may be configured to support the required communications protocol, both in terms of accepting commands for configuration and operation, as well as providing image data outputs. Alternatively, a communications processor may be installed as part of circuitry 125 to interface between a standard internal communication bus like SPI, USB, or others, and the FPA. As stated above, in the simplest case, the FPA can be interfaced through a connector or direct wiring to host processor I/O. For some PED embodiments, the length of circuit element with connector may be less than 1.5".

As stated above, the FPA may communicate with the host system controller in a variety of ways. The design considerations as to how to implement the communication may depend on the degree of customization inherent in the integration of the micro-core with the host system. On the highly customized end of the spectrum, the control and power lines for the FPA may be brought out and interfaced directly to host controller I/O and to the host system power supply. This may require that the host controller be specifically configured to directly control the FPA. On the other end, the micro-core may be designed to accept a standard communication and/or power protocol, such as SPI, USB, or manufacturer specific busses such as those used by Apple, Samsung, and others. In this case, at the very least, a communications processor and possibly power conditioning elements (regulators, filters and the like) may be required on the micro-core. In the most highly modular case, the micro-core may include processor(s) and memory for performing some or all of the image processing and image acquisition functions, and in particular, include memory for calibration data. These additional processor, communications, and memory components could be integrated as external components onto the flex circuit or substrate. It is also possible to fabricate such components as part of the FPA since the FPA can usually be microfabricated using silicon or other semiconductor processing that may be compatible with memory, processor, and other digital/analog circuitry. It may also be possible to fabricate the photodetector and associated interfaces at one set of fabrication design rules (e.g. linewidths in the 100s of nanometers) while fabricating the processor/memory portion at much smaller design rules (e.g. sub 100 nm linewidths) to improve performance and reduce power consumption.

Figure 1C:
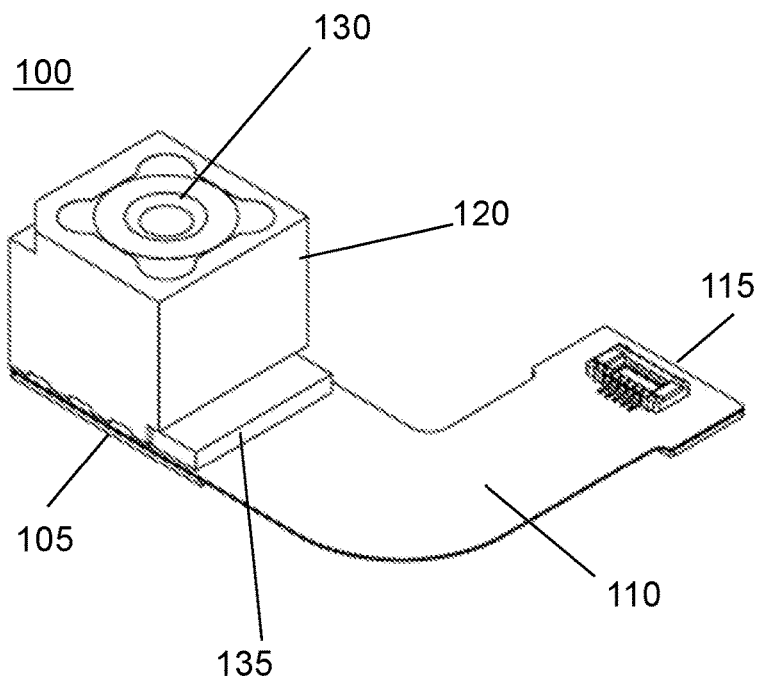
Figure 1D:
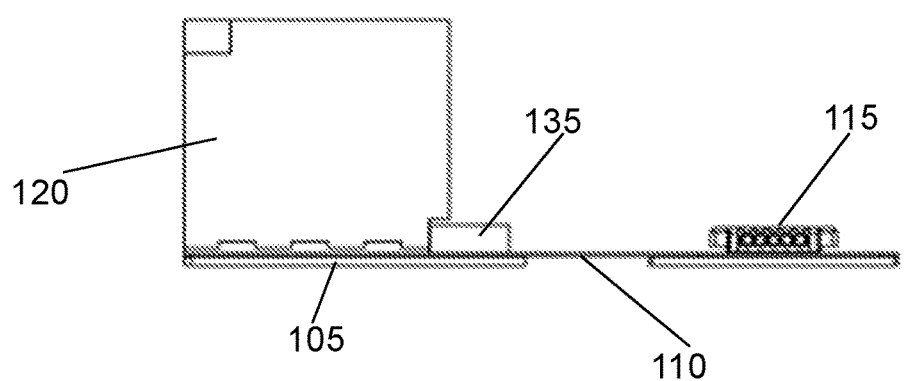

FIGS. 1C and 1D illustrate another concept for a micro-core 100. By way of showing alternative arrangements, in the embodiments of FIGS. 1C and 1D circuit element 110 is shown as being curved instead of straight. Such an arrangement is sometimes utilized for camera units integrated into devices such as smartphones, tablets and the like. In the embodiments shown in FIGS. 1C and 1D, lens mount 120 is constructed with a cutout on one side, and oscillator chip 135 is mounted on flex circuit 110 such that when the lens mount 120 is built onto the micro-core, oscillator 135 is captured by lens mount 120 and cannot be removed and changed without removing the lens mount. This arrangement is useful for applications where it may be advantageous to make difficult changing the operating frequency of the micro-core.

As discussed above, thermal imaging systems, particularly micro-bolometer based inexpensive mass-market oriented systems, are susceptible to a wide range of effects that affect image quality and thermographic accuracy. In particular, the conversion of image signal to image temperature, i.e. thermography, may be affected by both scene signal amplitude, related to scene temperature, and the ambient temperature the imaging sensor, i.e. FPA, is exposed to. The effects of scene and ambient temperature may vary from device to device, and the variation may be present at all levels of the system, including pixel-to-pixel variation within an individual unit, unit-to-unit variation within a given design, and from design to design. Higher cost imaging systems may provide more tools to mitigate these effects, such as means for sensor ambient temperature control, and controlled or known temperature calibration devices, such as temperature controlled or temperature monitored shutter flags. The present disclosure is directed to a micro-core with limited tools for mitigation of temperature effects.

The present disclosure assumes an imaging system with an integral ambient temperature sensor of a simple inexpensive implementation. Accordingly, the integral temperature sensor may be, but not necessarily, directly connected to the FPA. What is important is that a signal related to operational ambient temperature may be measured during actual use of the micro-core, and that this measured ambient temperature be correlated to the temperature of the photodetectors on the FPA. The temperature sensor performance may vary from unit to unit and may itself require calibration on a per unit basis. The thermography calibration process of the present disclosure makes use of the temperature sensor, as well as data acquired at various stages in system manufacturing.

Figure 2:
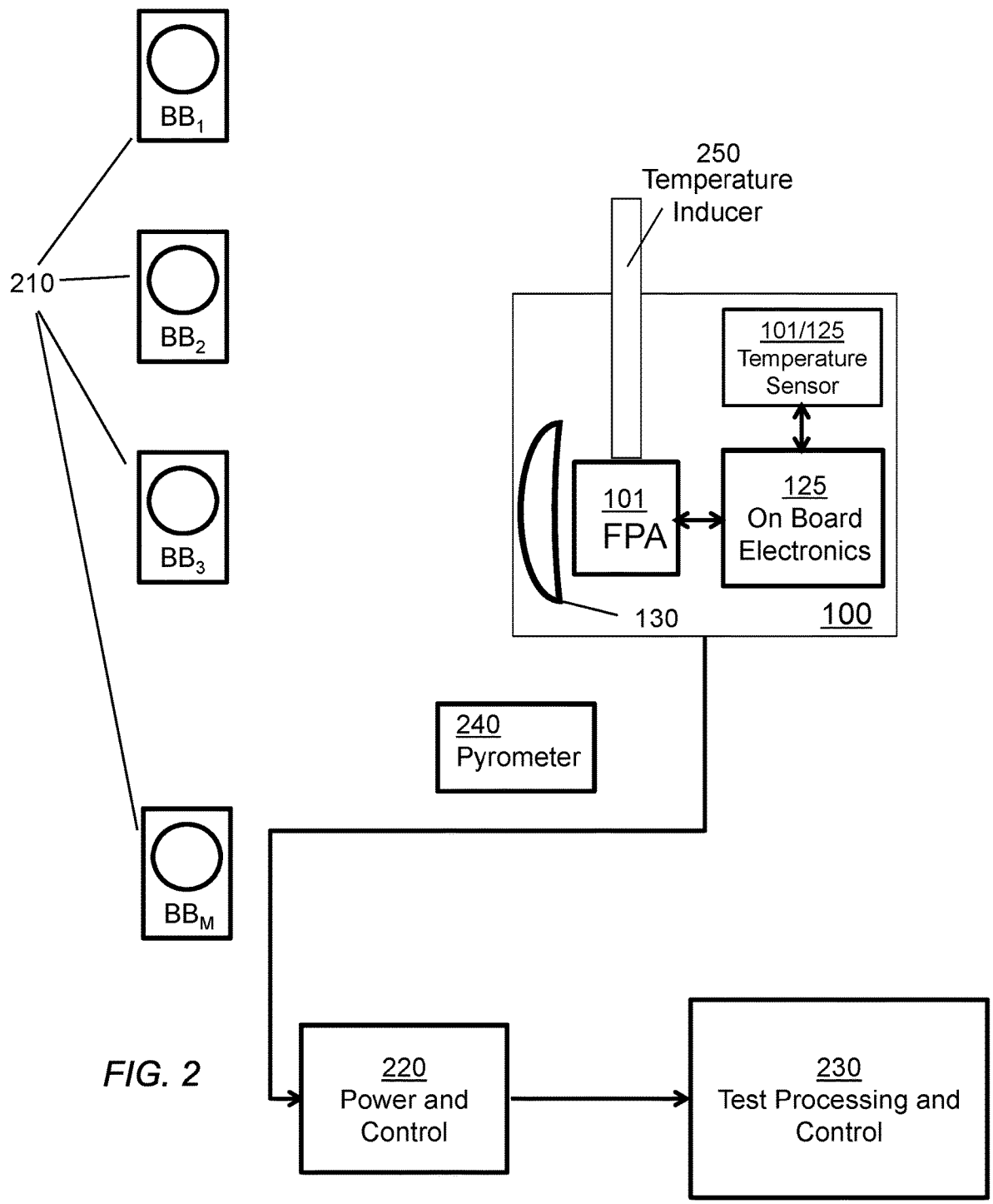
FIG. 2 shows schematically a test set-up for micro-cores.

FIG. 2 illustrates schematically a thermography calibration test that fully calibrates each micro-core and generates calibration data that is stored on or provided with the micro-core to be used in camera operation, either by the core itself or the processor(s) interfaced to the core in the host system. The micro-core of the current disclosure is small and therefor of limited thermal mass, and can therefore be particularly susceptible to temperature effects. It also may not, for many applications include a shutter, which typically can be used to correct for temperature effects. As such very complete characterization of the micro-core at the manufacturing test and calibration level may help ameliorate for these design challenges.

The complete testing is envisioned to be performed with multiple scene temperatures and at multiple controlled ambient temperatures. In the example test setup of FIG. 2, multiple scene temperatures are produced with several temperature controlled black-bodies 210, each set at a different temperature covering a range of expected scene temperatures. For instance, in an example test setup, six black bodies (M=6 in the Figure) covering a possible temperature range from 0° C. to 500° C. may be used. In the example test setup the black-bodies are in a normal room temperature environment, so particularly for lower than room temperature settings (where condensation or frosting may occur), the actual black-body surface temperature may not correspond to the setting. Therefore, the black-body surface temperature could be monitored with a pyrometer 240, and the pyrometer value may be used for the scene temperature. Different micro-core host systems may require different scene temperature ranges, but the example test set-up provides multiple scene temperature data points for any range achievable by the black-bodies.

The calibration test may also entail multiple controlled imaging sensor ambient temperatures. In the example setup of FIG. 2, core 100 is mounted on a temperature inducer 250, such that a temperature controlled heatsink is in contact with the core substrate, and configured to view each black-body 210 sequentially. FPA and/or module 100 needs to have an on-board temperature sensor (as stated above) for monitoring or measuring a temperature indicative of the FPA temperature. The inducer may be configured to cover a temperature range compatible with the host system. For example, a typical smartphone may be designed to operate over a temperature range of 15° C. to 50° C. The inducer may subject the core being tested to a plurality of ambient temperature data points, either in discrete steps or by sweeping the temperature. However the scene temperatures and/or the ambient temperatures are controlled and sequenced, the desired result is each bolometer in the FPA is imaging multiple black-body temperatures while operating at multiple operating FPA temperatures.

For each scene temperature at each ambient temperature, the actual known scene temperature is stored in a data set with the known scene temperature corresponding to the temp sensor value corresponding to the induced FPA temperature. The value of the ambient temperature sensor, $T_{sens}$ may vary with ambient temperature, desirably in a way that carries forward into operational use of the micro-core.

Accordingly, series of data sets are created for image pixels, for each black-body/ambient temperature combination, and the ambient temperature data corresponding to the temperature sensor readings. The calibration operation may be used to test all units, and the data sets may be brought forward for use in imaging system operation. The data sets may be derived for any number of pixels, including a table for each pixel. The resultant data sets are stored into each production unit. During actual use by a user, for any given actual observed signal and temperature sensor value, the closest corresponding actual scene temperature is found on the data set and reported to a user.

For greater accuracy, interpolation may be used when the signal levels and temperature sensor lie between the data points. Possible interpolation techniques include linear, bilinear, or bi-cubic interpolations. For any observed ambient temperature and signal, with interpolation, a value of the scene temperature within interpolated distance of actual calibration data is produced, leading to very accurate thermography data for the micro-core. It is also possible to pre-interpolate the data before interpolated values are needed, storing them for later operational use to avoid taking the extra time for the calculations for each image frame during camera use. Thus, the data actually stored may be several times denser than the test data points if subjected to pre-interpolation. It is also possible to store subsets of the test data and reconstruct with interpolation. Alternatively, interpolation could be done during non-imaging or camera downtimes during operation, such as at start-up. At any rate performing the interpolation at times other than actual imaging operation may be desirable.

The calibration data may be recorded and saved for later processing or processed during test depending on the processing capability designed into the test set-up. Calibration data may be acquired and stored for every pixel. However, if the FPA design is relatively uniform in terms of pixel response and temperature dependence, it may be possible to acquire calibration data from a smaller number of pixels, for example a group of center pixels, and use the reduced pixel calibration data for all pixels. The calibration data, once processed, may be provided with the micro-core for storage in the host system processor, or alternatively if the micro-core has memory capability stored onboard the micro-core.

In the discussion above, for simplicity, the description of the calibration process implies that each test point occurs at a predetermined FPA temperature and a predetermined scene temperature. However, even for a very small device such as the micro-core of this disclosure, waiting for the micro-core to come to temperature equilibrium when the heat sink temperature is changed may take an undesirably long time for high volume production. Therefore it may not be desirable to acquire data in a step and settle temperature fashion, but rather to continuously or partly continuously sweep the temperature and acquire data asynchronously with actual ambient temperature.

Such an approach is possible because, in reality as discussed above, during use the imaging system employing the micro-core may access the thermography table based on the reading of the onboard temperature sensor. Although it may be desirable to know the actual FPA temperature, scenes acquired looking at the temperature controlled black-bodies end up being correlated to the temp sensor reading regardless. It may be desirable to know the actual FPA temperature for other reasons, but in terms of accessing the thermography information, it is not necessary.

So it is possible, and potentially desirable, to continuously ramp the temperature of the micro-core under test, and as long as it is known which temperature black-body temperature is being viewed for each data point, which is straightforward for a variety of test setup configurations, a data set representing temp sensor reading vs pixel signal for a given scene temperature can still be generated for multiple scene temperatures and FPA temperatures. The data can be acquired much faster as the FPA temperature need never settle.

The data set acquired may be stretched in that the distance between acquired data points may not be consistent as it would for a step and settle arrangement. This effect may make interpolation less straightforward. This can be addressed in one of two ways. Either the stretched data may be pre-fit back to regular temperature increments, or if the temperature rate of change curve is known, the interpolation used may be arranged to follow the curve, rather than be a standard type of interpolation.

Figure 3:
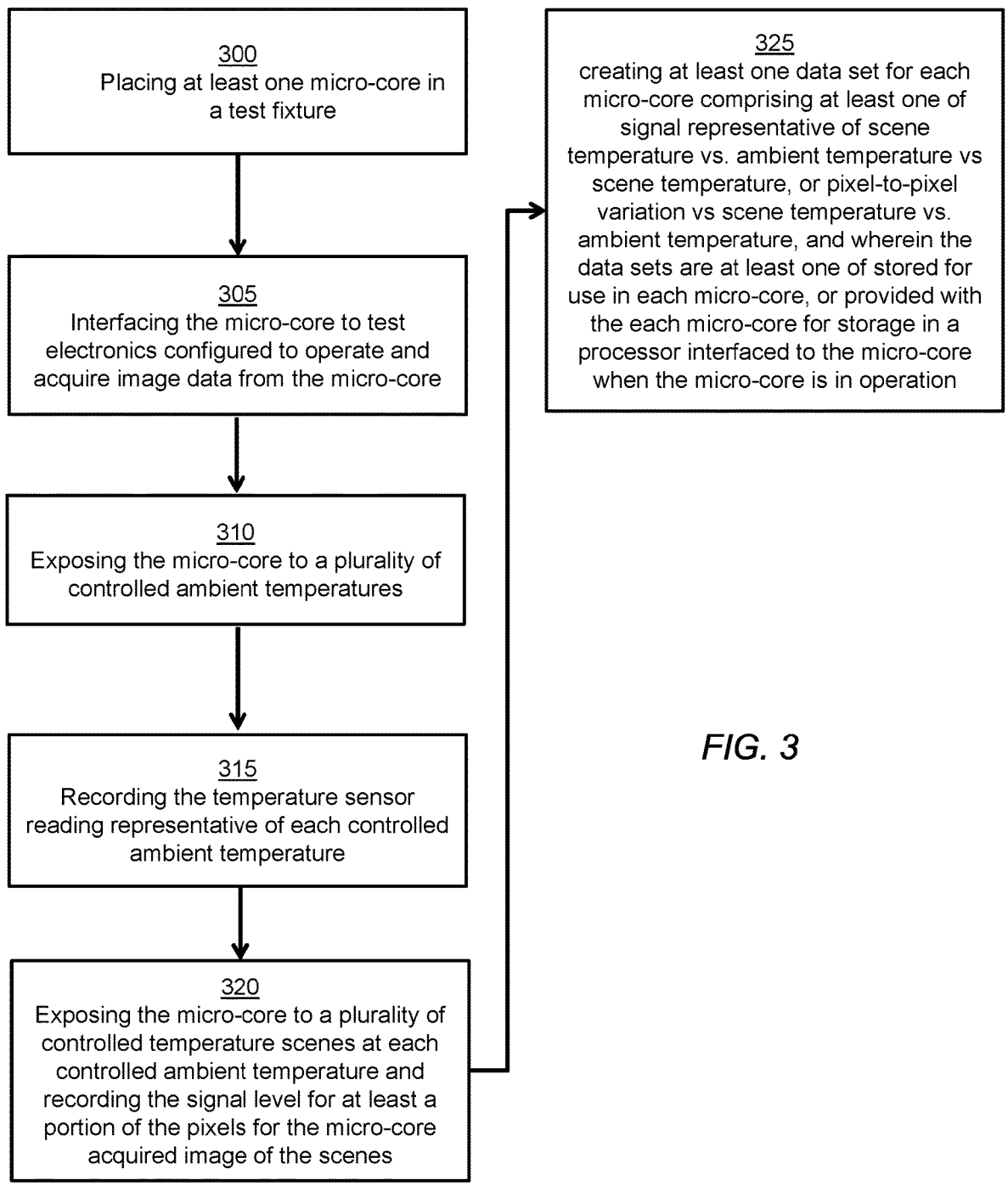
FIG. 3 shows a flow chart for an illustrative test process.

FIG. 3 is a flow chart showing the test process using a setup such as the one shown in FIG. 9.

Figure 4:
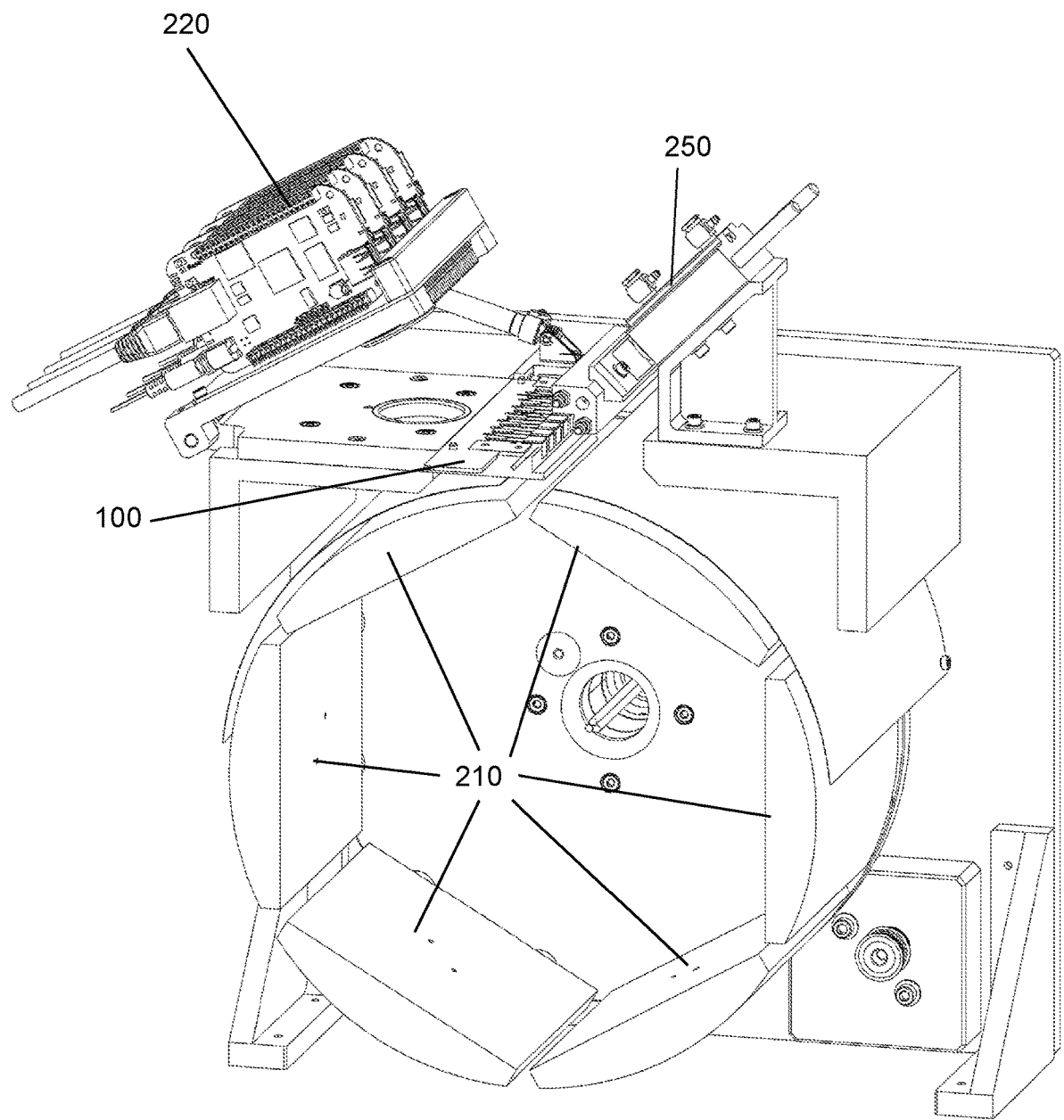
FIG. 4 shows an exemplary test set-up embodiment.

In order to make such a complete calibration practical for low cost/high volume units, the test set-up may need to be extremely efficient. FIG. 4 illustrates an exemplary test set-up that takes advantage of the small size and thermal mass of the micro-cores. The test set-up of FIG. 4 is shown for micro-cores of the configuration shown in FIGS. 1A and 1B. Micro-cores with straight flex circuits lend themselves well to be worked on in panels. A panel of micro-cores 100 is mounted to ambient temperature inducer 250. In the embodiment shown the inducer is a heat sink configured to make contact with each substrate of each micro-core in the panel—the heat sink being quite small and thin as it only has to cover all or part of the small substrate surface area. The heat sink may be rapidly changed in temperature by applying a temperature inducer to the heat sink. For instance, in the embodiment shown, temperature controlled fluid is injected into channels in the heat sink. Over the smartphone temperature range, which is relatively close to room temperature, the temperature of the heat sink can be changed rapidly (within a few seconds). The heat sink may also be temperature controlled with other means such as thermoelectric heaters. The cores are integrated with a test processor through interface electronics 220. Scene temperatures are produced with a series of black-bodies 210, basically consisting of suitably coated metal plates with high thermoconductivity interfaced to thermo-electric heaters and mounted to a spinning wheel controlled by a processor. The black-body plates may be curved to be equidistant from the lens of each core in a panel. The black-bodies are sized to fill the field-of-view of all the cores on the panel. Thus, for each ambient temperature, data from all the cores in a panel may be acquired in parallel for each black-body position. A panel of micro-cores may be fully calibrated in a few minutes at most. Such a complete calibration at this speed is unprecedented in the thermal imaging field. In some embodiments, the heat sink, electronics interface, and carousel together fit into a volume less than 1 cubic foot.

For testing over extended temperature ranges, particularly on the cold end, it may be desirable to introduce further environmental control. For instance, if the ambient temperature range is extended to a range suitable for more extreme environment or military requirements, ambient temperatures as low as −15° C. may be desirable. In order to avoid condensation and frosting, it may be desirable to have further environmental control over the test setup. For instance, the test setup may be placed entirely into a controlled environment, such as a partial vacuum chamber or a desiccated room/chamber.

Figure 5A:
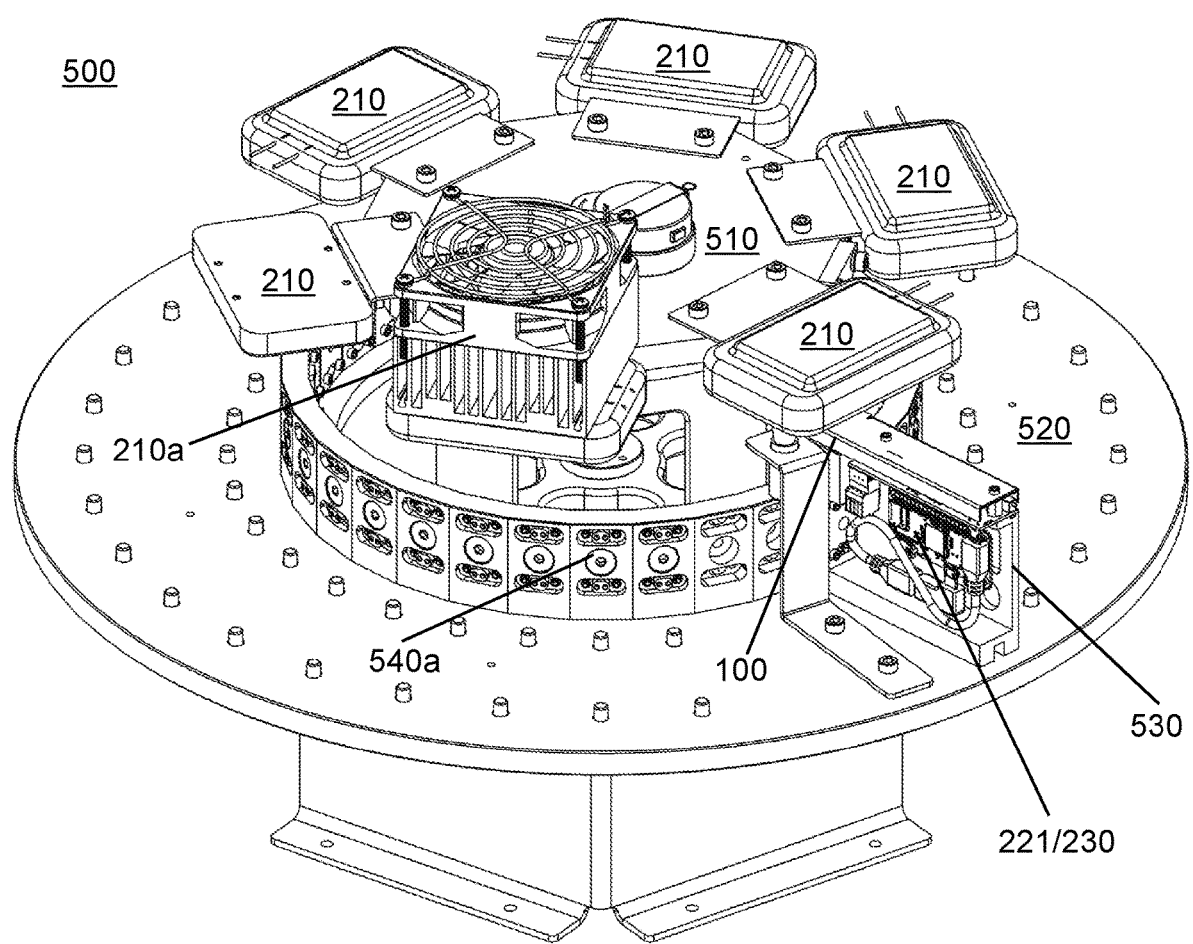
FIGS. 5A, 5B, and 5C show an alternative exemplary test set-up embodiment.

Referring to FIG. 5A, an alternative test set-up, showing a micro-core 100 of the configuration of FIGS. 1C and 1D is shown. In this embodiment, micro-core 100 is pre-mounted in module 530. Module 530 contains interface electronics and power control electronics 221/230, intended to power, operate and capture/process image information for micro-core 100. In the embodiment shown, module 530 also includes a wireless networking facility, allowing the module to communicate with a central test controller. This allows for the interface between the module and the test set-up to be simply power and ground, shown as connections 540a, which in the embodiment shown includes 4 electrical connections and a magnetic alignment pad. Thus 530e may be installed in the embodiment shown by simply being slid onto the module plate 520 and aligned in electrical connection quickly and easily. In the embodiment shown, the test setup includes two rotatable plates: module plate 520 and black-body plate 510 holding black-bodies 210. One or both plates are rotatable. In the embodiment shown, black-body plate 510 is rotated by a motor, while module plate is hand rotatable between two positions (180 degrees apart) to facilitate loading and unloading of the modules. Other suitable rotating schemes could be employed as well. In some embodiments, black-bodies include other components such as cooling fans, control electronics and insulation as shown at 210a.

Figure 5B:
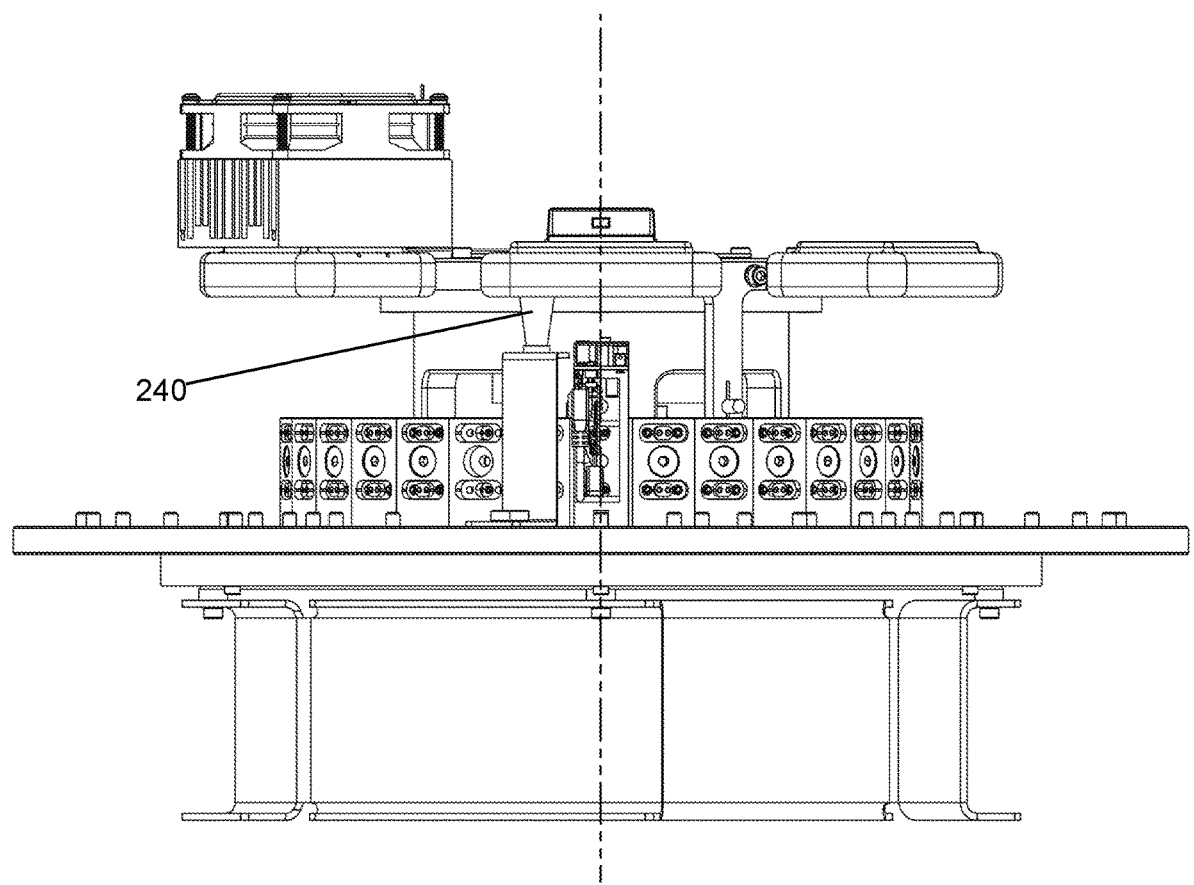

FIG. 5B shows another view of the test set-up of FIG. 5A. Sensors 240, such as a pyrometer for verifying black body temperature may be employed. Also position sensors for monitoring the relative positions of the two plates may be used. In order to allow for mutual rotation while allowing electrical contact to the component on the plates as well as the modules, slip ring connectors may be used. By making the modules wirelessly connectible to the outside world, the electrical connections through the slip rings can be limited to power, ground and a few sensor signals, thus simplifying the slip ring connectors while maintaining rotational flexibility. Sensors could also be mounted on the modules, so these signals could also be communicated wirelessly. The black bodies 210 may be simply operated at predetermined power levels, or more complex control could be used, which could also be accomplished with controllers that wirelessly communicate with a central test computer.

Figure 5C:
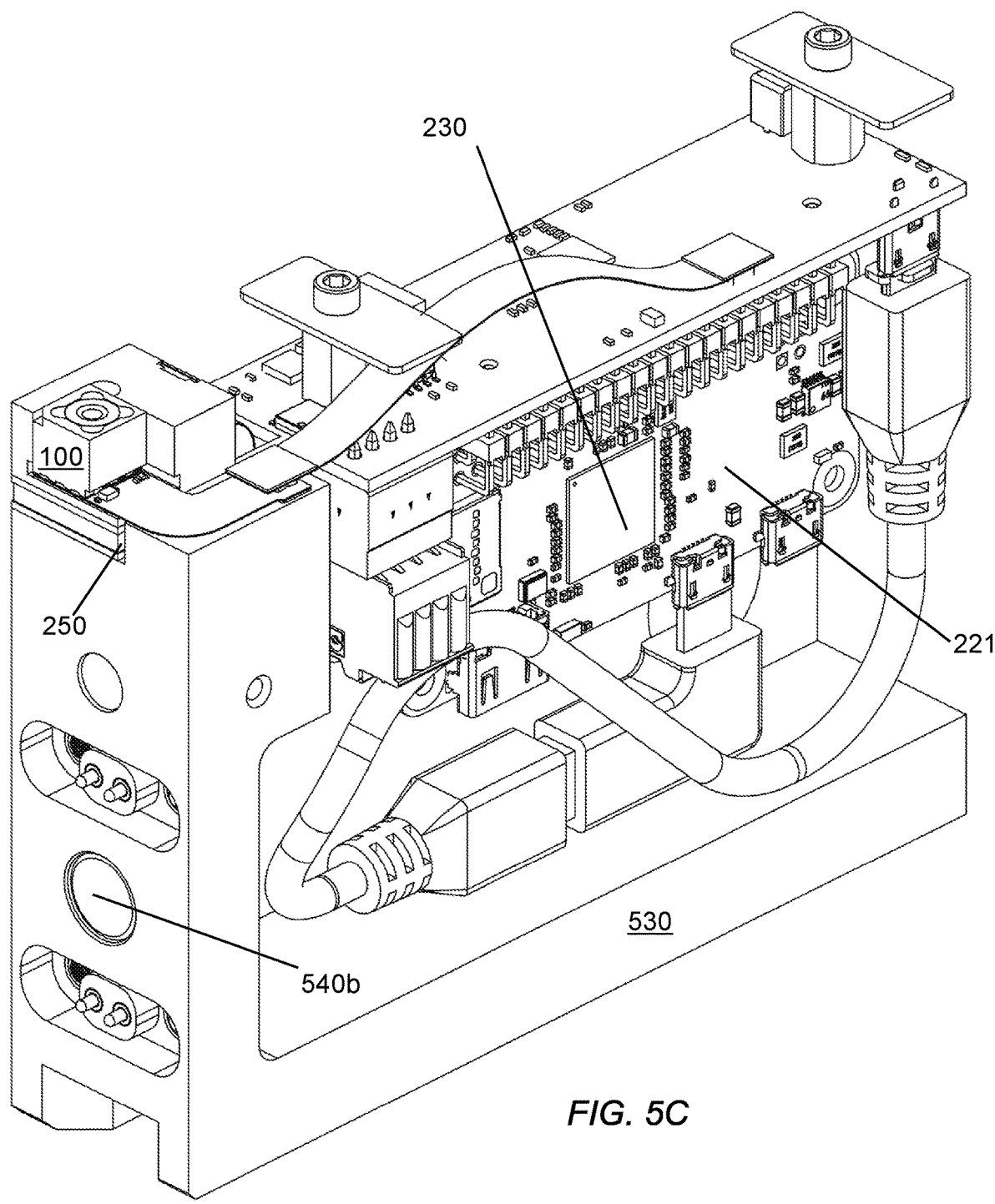

FIG. 5C shows details of the module 530. Micro-core 100 is mounted to a heat sink acting as a temperature inducer, which may be heated and cooled by way of a thermoelectric device, shown at 250. Mating electrical and magnetic alignment components 540b mate with corresponding component 540a on the test set-up. Power control 230 and interface electronics 221, including wireless networking are capable of operating the micro-core and acquiring image data.

An exemplary mode of operation is envisaged as follows: Micro-cores 100 are mounted onto modules 530, which in turn are placed onto/removed from module plate 520, ether robotically or by hand. Electrical/magnetic alignment components 540a and b aid in simplifying module installation. Black-bodies 210 are powered to levels corresponding to desired scene temperatures. Black body plate 510 is rotated, either continuously or stepwise relative to installed modules 530, with the actual black-body temperatures optionally monitored by one or more pyrometers 240 and the relative positions of the plates and or modules relative to each black-body are optionally monitored by position sensors. The heat sink on the modules is ramped either continuously or step wise. The onboard FPA temperature sensor signal is monitored. Scene data is collected at various scene temperatures as the black-bodies are rotated into view of each module at a plurality of temp sensor values. Image scenes along with black-body temperature, ambient temp sensor reading, and micro-core ID data is acquired by the module electronics/processing elements and passed wirelessly to test computer. When a desired range of data has been acquired for a particular module, an indication to remove the module is provided, either by the test computer or an on-module indicator (e.g. status light) or both. As modules finish, they are replaced and the test cycling may be continuous. The data sets need for calibration, thermography and other operational uses are generated by the test computer and either loaded onto the micro-cores or are otherwise associated with each core.

The embodiments described herein are exemplary. Modifications, rearrangements, substitute processes, alternative elements, etc. may be made to these embodiments and still be encompassed within the teachings set forth herein. One or more of the steps, processes, or methods described herein may be carried out by one or more computer/logic processing elements.

Depending on the embodiment, certain acts, events, or functions of any of the method steps described herein can be performed in a different sequence, can be added, merged, or left out altogether (e.g., not all described acts or events are necessary for the practice of the algorithm). Moreover, in certain embodiments, acts or events can be performed concurrently, rather than sequentially.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements, and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B, and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or methods illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. A test station for testing a micro-core comprising a focal plane array (FPA) microfabricated of a first material, a lens, a substrate of a second material carrying the FPA, a circuit element with a connector, and a temperature sensor for sensing a temperature indicative of the FPA temperature, wherein the first and second materials are substantially thermally matched, the FPA is bonded to the substrate, the optical element is attached to the housing, the housing is bonded to the substrate with the optical element disposed to expose the FPA to external scenes, the circuit element is configured to provide connections between the FPA and the connector, and the housing, substrate, and FPA assembled together are less than 1.5" long and 0.5" in all other dimensions, the test station comprising:
   a mount for at least one of a micro-core or a panel of a plurality of micro-cores comprising a heat sink that contacts the micro-core substrate adjacent to the FPA;
   a temperature inducing element that variably sets the heat sink temperature;
   an electronic interface for the micro-core providing power, control signals, data image acquisition interface to a test computer;
   a carousel comprising a plurality of independently temperature controlled black-bodies configured to present full-field flat known temperature scenes to the micro-core;
   wherein the black-bodies are curved black-bodies and the carousel is configured with the curved black-bodies on the inside of a cylinder, surrounding the micro-cores under test and rotatable to place each black body in view of each micro-core.

2. The test station of claim 1 further comprising a pyrometer to verify black-body temperature.

3. The test station of claim 1 wherein the heat sink temperature is varied and controlled by at least one of a thermo-electric heater or temperature controlled fluid injected into channels in the heat sink.

4. The test station of claim 1 wherein the micro-cores are mounted onto test modules, which contain one or more of power conditioning, processing, micro-core ambient temperature inducers, and wireless networking elements, whereby the micro cores are identifiable and operable, their ambient temperatures changed and controlled while reading micro-core temperature sensors, and image scenes acquired from known black-body temperatures, and the scene temperature, ambient temperature, image data and identification data is wireless transmitted to a test computer.

5. The test station of claim 4 wherein the temperature inducer comprises a thermoelectric device which continuously varies the micro-core ambient temperature over a predetermined range as the blackbodies are rotated into view, and records the micro-temperature sensor reading at a plurality of ambient temperatures covering the predetermined range as the micro-core passes each blackbody.

6. The test station of claim 4 wherein the blackbody carousel is continuously rotated and modules are loaded and unloaded by one of by hand or robotically as testing is completed thereby achieving continuous high throughput testing.

7. A process for testing a thermal imaging micro-core using the test station of claim 1, the process comprising:
   placing at least one micro-core in the test station;
   interfacing the at least one micro-core to the test computer via the electronic interface, the test computer configured to operate and acquire image data from the micro-core;
   exposing the at least one micro-core to a plurality of controlled ambient temperatures;
   recording the temperature sensor reading representative of each controlled ambient temperature;

exposing the micro-core to a plurality of controlled temperature scenes via the carousel at each controlled ambient temperature and recording the signal level for at least a portion of the pixels for the micro-core acquired image of the scenes; and, creating at least one data set for each micro-core comprising at least one of the signal representative of scene temperature vs. ambient temperature sensor reading, or pixel-to-pixel variation vs. scene temperature vs. ambient temperature sensor reading, wherein the data sets are at least one of stored for use in each micro-core, or provided with the each micro-core for storage in a processor interfaced to the micro-core when the micro-core is in operation.

8. The process of claim 7 wherein the micro-cores are mounted on a panel and the panel is mounted to the test station.

9. The process of claim 7 wherein the ambient temperature is controlled by mounting the micro-core to the heat sink.

10. The process of claim 9 wherein the heat sink temperature is controlled by at least one of a thermo-electric device or temperature controlled fluid flowed through channels in the heat sink.

11. The process of claim 7 wherein the controlled temperature scenes are a plurality of individually temperature controlled black-bodies sequentially presented for viewing by the micro-core.

12. The process of claim 7 wherein the black-bodies are in the form of curved plates on the carousel, sequentially rotated around an in view of the micro-core(s).

13. The process of claim 7 wherein the micro-cores are mounted onto test modules which contain one or more of power conditioning, processing, micro-core ambient temperature inducers, and wireless networking elements.

14. The process of claim 13 wherein the temperature inducer comprises a thermoelectric device which continuously varies the micro-core ambient temperature over a desired range as the blackbodies are rotated into view, and records the micro-temperature sensor reading at a plurality of ambient temperatures covering the desired range as the micro-core passes each blackbody.

15. The process of claim 7 wherein the black-body temperatures are measured by a pyrometer, and the pyrometer measured temperature is stored in the table.

* * * * *